United States Patent
Lee et al.

[11] Patent Number: 6,146,953
[45] Date of Patent: Nov. 14, 2000

[54] FABRICATION METHOD FOR MOSFET DEVICE

[75] Inventors: Kye-Nam Lee, Cheongju; Jeong-Hwan Son, Daejon, both of Rep. of Korea

[73] Assignee: Hyundai Electronics Industries Co., Ltd., Kyounki-do, Rep. of Korea

[21] Appl. No.: 09/148,078

[22] Filed: Sep. 4, 1998

[30] Foreign Application Priority Data

Apr. 20, 1998 [KR] Rep. of Korea ............ 98-14043

[51] Int. Cl.⁷ .......... H01L 21/331; H01L 21/334; H01L 21/335; H01L 21/8236; H01L 21/8238
[52] U.S. Cl. .......... 438/289; 438/305; 438/306; 438/369; 438/370; 438/372; 438/373; 438/376; 257/219; 257/220; 257/221; 257/285; 257/327; 257/335; 257/345; 257/404; 257/408
[58] Field of Search .......... 438/306, 307, 438/217, 289; 257/404

[56] References Cited

U.S. PATENT DOCUMENTS

| | | | |
|---|---|---|---|
| 3,653,978 | 4/1972 | Robinson et al. | 148/1.5 |
| 4,502,205 | 3/1985 | Yahano | 29/576 B |
| 4,514,893 | 5/1985 | Kinsbron et al. | 29/571 |
| 4,675,981 | 6/1987 | Naruke | 29/576 B |
| 4,679,303 | 7/1987 | Chen et al. | 29/571 |
| 4,895,520 | 1/1990 | Berg | 438/289 |
| 5,030,581 | 7/1991 | Yakushiji et al. | 438/135 |
| 5,082,794 | 1/1992 | Pfiester et al. . | |
| 5,141,895 | 8/1992 | Pfiester et al. | 438/289 |
| 5,296,387 | 3/1994 | Aronowitz et al. | 438/301 |
| 5,312,766 | 5/1994 | Aronowitz et al. | 438/291 |
| 5,374,571 | 12/1994 | Mukherjee et al. | 438/268 |
| 5,401,994 | 3/1995 | Adan | 257/335 |
| 5,428,234 | 6/1995 | Sumi | 257/287 |
| 5,434,093 | 7/1995 | Chau et al. . | |
| 5,536,957 | 7/1996 | Okumura | 257/336 |
| 5,548,143 | 8/1996 | Lee | 257/269 |
| 5,719,422 | 2/1998 | Burr et al. | 257/336 |
| 5,719,430 | 2/1998 | Goto | 257/403 |
| 5,726,477 | 3/1998 | Williams et al. | 257/402 |
| 5,733,812 | 3/1998 | Ueda et al. | 438/289 |
| 5,786,620 | 7/1998 | Richards, Jr. et al. | 257/408 |
| 5,817,558 | 10/1998 | Wu | 438/291 |
| 5,899,719 | 5/1999 | Hong | 438/289 |

*Primary Examiner*—Tom Thomas
*Assistant Examiner*—Bernard E. Souw

[57] ABSTRACT

A fabrication method for a MOSFET device including the steps of forming a first insulating film on a semiconductor substrate wherein an active region and an isolated region are defined, forming a channel ion region by implanting impurity ions into the active region of the semiconductor substrate, forming a first conductive film pattern on a portion of the semiconductor substrate which corresponds to the channel ion region, forming a channel region having lower concentration than the channel ion region by implanting impurity ions in a different type from the ions in the channel ion region into a center portion of the channel ion region through the first conductive film pattern, forming a second conductive film pattern on the first conductive film pattern, forming an impurity region of low concentration in the semiconductor substrate with the first and second conductive film patterns as a mask, forming a sidewall spacer at both sides of the first and second conductive film patterns, and forming an impurity region of high concentration in the semiconductor substrate with the first and second conductive film patterns and the sidewall spacer as a mask. The present invention has advantages of improving the inferior-quality problem of semiconductor devices due to a short channel effect when a gate has a critical size and also preventing junction leakage in the junction between ion regions.

15 Claims, 3 Drawing Sheets

FABRICATION METHOD FOR MOSFET DEVICE

BACKGROUND OF THE INVENTION

1. Field of the Invention

The present invention relates to a semiconductor device, and more particularly to a fabrication method for a metal oxide semiconductor field effect transistor (MOSFET) device capable of settling deterioration of short channel effect (SCE) due to decrease in critical size of gates and preventing junction leakage from occurring in a junction region between ion regions.

2. Discussion of the Background

FIGS. 1A to 1D sequentially illustrate a conventional fabrication method for a MOSFET device.

In FIG. 1A, a buffer oxide film 11 is formed on an upper surface of a semiconductor substrate 10, a nitride film 13 is formed on the buffer oxide film 11 and a channel region 14 is formed by implanting impurities into an opened area of the semiconductor substrate 10.

In an N-channel MOSFET (hereinafter, called NMOSFET), the semiconductor substrate 10 is P-type, and in a P-channel MOSFET (hereinafter, called PMOSFET), the substrate 10 is N-type, i.e., the impurities are P-type in NMOSFET and N-type in PMOSFET. Further, the channel region 14 defines a threshold voltage.

As shown in FIG. 1B, after removing the nitride film 13 and the buffer oxide film 11, a gate oxide film 15 and a polysilicon film 16 are sequentially formed on the semiconductor substrate 10. A photoresist pattern 17 is formed on the polysilicon film 16 and, with the photoresist pattern 17 as a mask, $N^+$-type ions in case of MOSFET (or $P^+$-type ions in PMOSFET) are implanted into the polysilicon film 16 (polysilicon doping). Here, when forming the photoresist pattern 17, an upper surface of a portion of the polysilicon film 16 above the channel region 14 is opened.

As shown in FIG. 1C, the photoresist pattern 17 is removed and the polysilicon film 16 is patterned, thus forming a gate 18. With the gate 18 as a mask, low-concentration ions (NMOS: n-, PMOS: p -) are implanted into the semiconductor substrate 10, thus a lightly-doped-drain (LDD) ion region 19 is formed at each side of the channel region 4 in the semiconductor substrate 10.

As shown in FIG. 1D, a side wall 20 is formed at both sides of the gate 18. Finally, high-concentration ions (NMOS: n+, PMOS: p+) and opposite-type ions thereof (NMOS: p+, PMOS: n+) are sequentially implanted into the semiconductor substrate 10, for thus forming a source/drain region 21 and a halo-type ion implantation region 22, respectively.

However, the conventional fabrication method for the MOSFET device has some problems.

First, as the size of the semiconductor devices decrease the critical size of gates should also decrease. This reduction of critical size may cause a short channel effect (SCE) to occur leading to poor quality devices.

Second, to alleviate the above problem, the halo ion region 22 has the opposite type of the source/drain region 21. However, due to the excessive concentration difference between the source/drain region 21 and the halo ion region 22, junction leakage can occur in a junction region between the two regions 21, 22.

SUMMARY OF THE INVENTION

Accordingly, the present invention is directed to a MOSFET device which obviates the problems due to limitations and disadvantages of the related art.

An object of the present invention is to provide a fabrication method for MOSFET that improves an inferior-quality problem of semiconductor devices due to SCE.

Another object of the present invention is to provide a fabrication method for MOSFET that prevents the junction leakage from occurring in a junction between ion regions.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a fabrication method for MOSFET includes forming a first insulating film on a semiconductor substrate wherein an active region and an isolated region are defined, forming a channel ion region by implanting impurity ions into the active region of the semiconductor substrate, forming a first conductive film pattern on a portion of the semiconductor substrate which corresponds to the channel ion region, forming a channel region having lower concentration than the channel ion region by implanting impurity ions in a different type from the ions in the channel ion region into a center portion of the channel ion region through the first conductive film pattern, forming a second conductive film pattern on the first conductive film pattern, forming an impurity region of low concentration in the semiconductor substrate with the first and second conductive film patterns as a mask, forming a sidewall spacer at both sides of the first and second conductive film patterns, and forming an impurity region of high concentration in the semiconductor substrate with the first and second conductive film patterns and the sidewall spacer as a mask.

It is to be understood that both the foregoing general description and the following detailed description are exemplary and explanatory and are intended to provide and further explanation of the invention as claimed.

BRIEF DESCRIPTION OF THE DRAWINGS

The accompanying drawings, which are included to provide a further understanding of the invention and are incorporated in and constitute a part of this specification, illustrate an embodiment of the invention and together with the description serve to explain the principles of the invention.

In the drawings.

DETAILED DESCRIPTION OF THE INVENTION

Reference will now be made in detail to the preferred embodiment of the present invention, examples of which are illustrated in the accompanying drawings.

FIGS. 2A to 2F sequentially illustrate a fabrication method for a MOSFET device according to an embodiment the present invention.

Figure 1A:
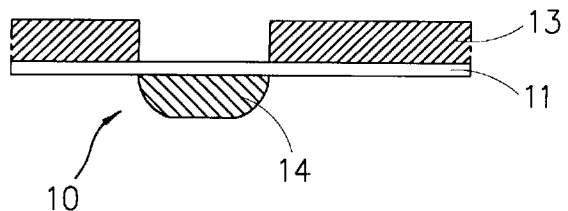
FIGS. 1A to 1D are vertical cross-sectional diagrams sequentially illustrating a conventional fabrication method for a MOSFET device.
Figure 1B:
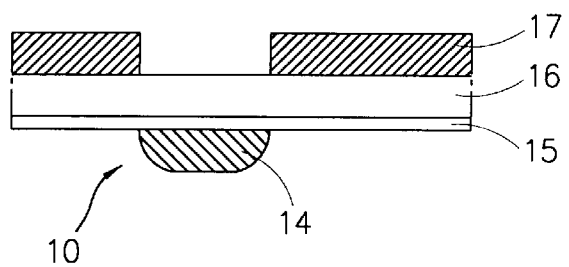
Figure 1C:
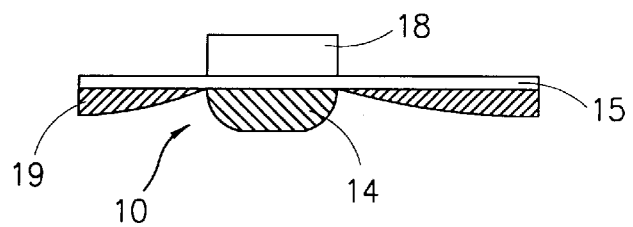
Figure 1D:
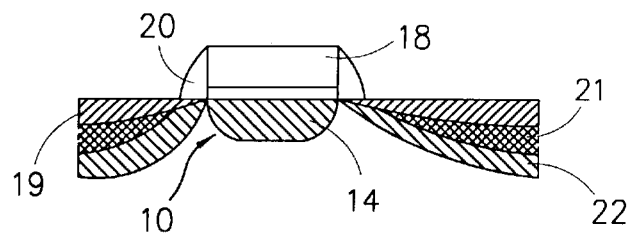
Figure 2A:
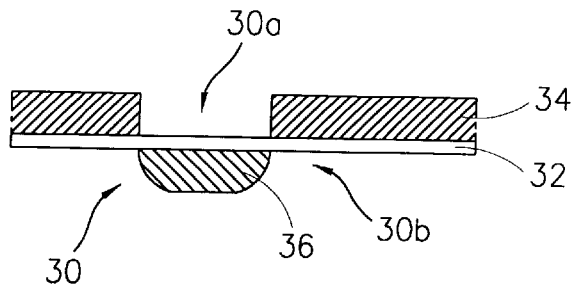
FIGS. 2A to 2F are vertical cross-sectional diagrams sequentially illustrating a fabrication method for a MOSFET device according to an embodiment of the present invention.

First, as shown in FIG. 2A, a first insulating film 32 for, e.g., a buffer oxide film, is formed on a semiconductor substrate 30 (NMOS: P-type, PMOS: N-type) wherein an active region 30a and an isolated region 30b are defined, and a second insulating film 34 is formed thereon. Here, a portion of the second insulating film 34 which is to be a gate-formed-area, that is the active region 30a, is opened. With the second insulating film 34 as a mask, P+ ions in case of NMOS (or N+ ions in PMOS) are implanted into the opened area, thus forming a P-type channel ion region 36 in the semiconductor substrate 30.

Figure 2B:
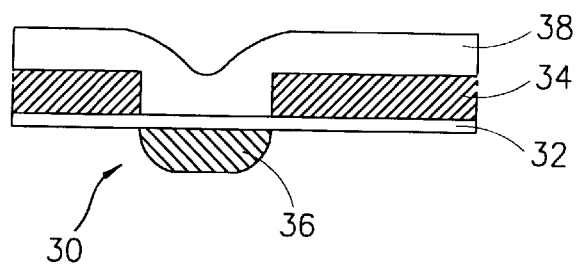

As shown in FIG. 2B, a first conductive film 38 is formed on the second insulating pattern 34 including an upper surface of the opened portion of the first insulating film 32.

Figure 2C:
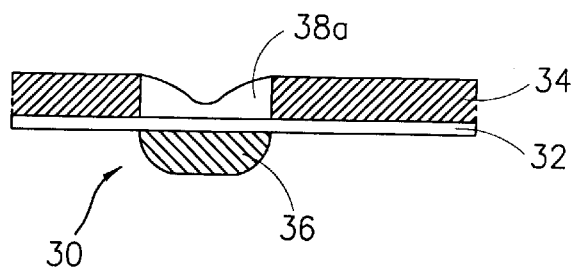

Next, as shown in FIG. 2C, a portion of the first conductive film 38 which corresponds to an upper surface of the second insulating pattern 34 is removed by a chemical mechanical polishing (CMP) method, thus forming a first conductive film pattern 38a of which both end sides are formed thicker than a center portion, i.e., the center portion is lower in height.

Figure 2D:
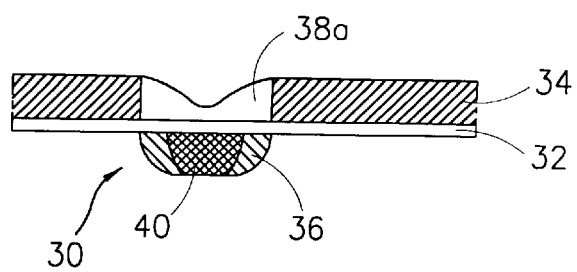

As shown in FIG. 2D, ions having the opposite type to the ions of the channel ion region 36, that is the N+ ions in case of NMOS (or the P+ ions in PMOS), are implanted into the first conductive film pattern 38a. Thus, counter doping occurs and a P-type channel region 40, of which ion concentration is lower than that of the channel ion region 36, is formed in a center portion of the channel ion region 36. Here, the N+ ions used for the ion implantation have energy which is able to penetrate the center portion of the first conductive film pattern 38a, but not the edge portions thereof.

Figure 2E:
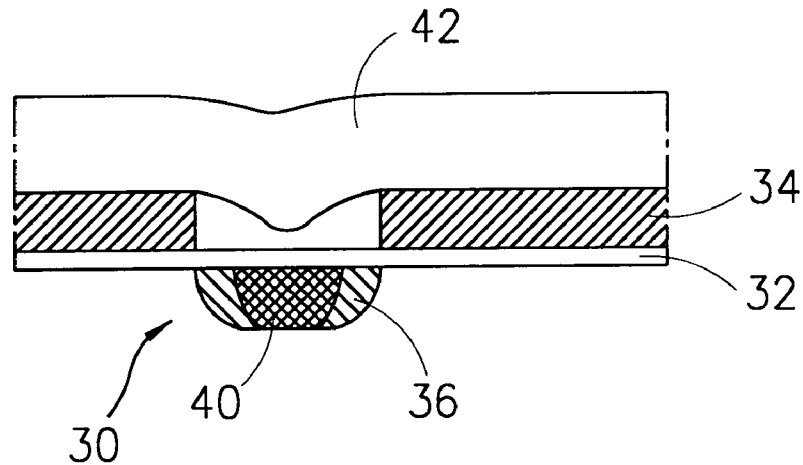
Figure 2F:
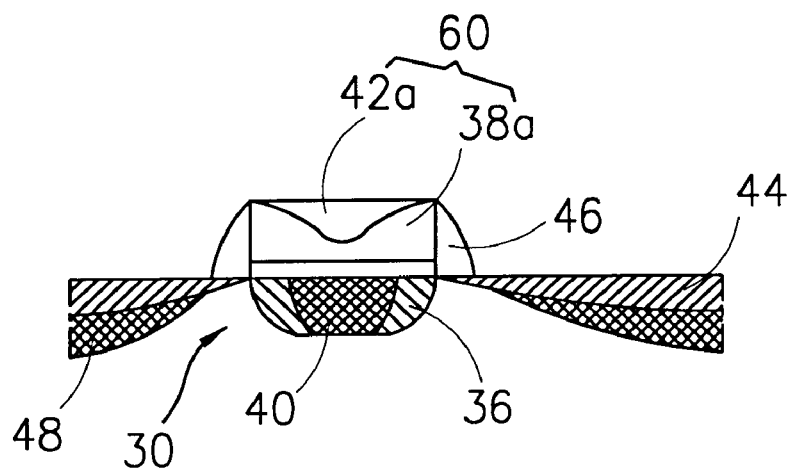

As shown in FIG. 2E, a second conductive film 42 having a material such as polysilicon is formed on the first conductive film pattern 38a and the second insulating film 34 and, in FIG. 2F, the second conductive film 42 is ground by the CMP method such that the upper surface of the second insulating pattern 34 is exposed, for thus forming a second conductive film pattern 42a. During to the above grinding process, the second conductive film pattern 42a fills in the center portion of the first conductive film pattern 38a such that an upper surface is planarized.

In this embodiment, when the first and second conductive films are doped polysilicon, a separate doping process for the polysilicon is not required. If the conductive films are not been doped, the second conductive film pattern is formed after the CMP method and then the ion implantation (NMOS: N-type, PMOS: P-type) are performed.

A part of the first conductive film pattern 38a and second conductive film pattern 42a becomes a gate 60. Next, the second insulating pattern 34 is removed, and a low-concentration impurity region 44, which will be a lightly-doped-drain LDD region, is formed at both sides of the first conductive film pattern 38a in the semiconductor substrate 30, and a sidewall 46 is formed at both sides of the gate 60. Lastly, a high-concentration impurity region 48 which will be a source/drain region is formed at both sides of the gate 60 including the sidewall 46 in the semiconductor substrate 30.

As described above, the fabrication method for MOSFET according to the present invention implements the ion implantation into the first conductive film pattern in a center-hollow shape, thus forming the ion region in the center part of the channel region of which the ion concentration is lower than that of the channel region, thus improving the inferior-quality problem of the semiconductor devices due to SCE and also preventing the junction leakage occurred in the junction between the ion regions.

It will be apparent to those skilled in the art that various modifications and variations can be made in the fabrication method for MOSFET of the present invention without departing from the spirit or scope of the invention. Thus, it is intended that the present invention cover the modifications and variations of this invention provided they come within the scope of the appended claims and their equivalents.

What is claimed is:

1. A fabrication method for a metal oxide semiconductor field effect transistor (MOSFET), comprising:

forming a first insulating film on a semiconductor substrate wherein an active region and an isolated region are defined;

forming a channel ion region by implanting impurity ions into the active region of the semiconductor substrate;

forming a first conductive film pattern on a portion of the semiconductor substrate which corresponds to the channel ion region;

forming a channel region having lower concentration than the channel ion region by implanting impurity ions in a different type from the ions in the channel ion region into a center portion of the channel ion region through the first conductive film pattern;

forming a second conductive film pattern on the first conductive film pattern;

forming an impurity region of low concentration in the semiconductor substrate with the first and second conductive film patterns as a mask;

forming a sidewall spacer at both sides of the first and second conductive film patterns; and forming an impurity region of high concentration in the semiconductor substrate with the first and second conductive film patterns and the sidewall spacer as a mask.

2. The method of claim 1, wherein the channel ion region is formed by forming a second insulating film pattern on the semiconductor substrate such that an upper surface of the active region thereof is exposed and implanting impurity ions into the exposed portion of the semiconductor substrate with the second insulating film pattern as a mask.

3. The method of claim 1, wherein the first conductive film pattern is formed by the steps, comprising:

forming the second insulating film pattern on the semiconductor substrate such that the upper surface of the active region thereof is exposed;

forming the channel ion region by implanting the impurity ions into the exposed portion of the semiconductor substrate with the second insulating film pattern as the mask;

forming a first conductive layer on the second insulating film pattern and the exposed surface of the semiconductor substrate by a chemical vapor deposition method; and etching the first conductive layer by a chemical mechanical polishing method so that an upper surface of the second insulating film pattern is exposed.

4. The method of claim 3, wherein an etch-back method is applied to the first conductive layer instead of the chemical mechanical polishing method.

5. The method of claim 1, wherein an upper surface of the first conductive film pattern is a dish-shape of which a center thereof caves in.

6. The method of claim 1, wherein energy of the impurity ions having the different type from the ions in the channel ion region which are implanted into the center portion of the channel ion region can penetrate a middle portion of the first conductive film pattern but not penetrate a side portion thereof.

7. The method of claim 1, wherein the second conductive film pattern is formed by forming a second conductive layer on the first conductive film pattern and the second insulating film pattern and etching the second conductive layer by the chemical mechanical polishing method in order that an upper surface of the second insulating film pattern is exposed.

8. The method of claim 7, wherein the etch-back method is applied to the second conductive layer instead of the chemical mechanical polishing method.

9. The method of claim 1, wherein the sidewall spacer is formed by forming a third insulating film on the semiconductor substrate including the first and second conductive film patterns by a low-temperature chemical vapor deposition method and anisotropically etching the third insulating film without using a mask.

10. The method of claim 1, wherein in the channel region of low concentration formed by implanting the ions having the different type from the ions in the channel ion region into the channel ion region, either of electrons or holes which are carriers have lower concentration in accordance with production of a hole-electron pair.

11. The method of claim 1, wherein when the semiconductor substrate is P-type the channel ion region is P+, and when the semiconductor substrate is N-type the same is N+.

12. The method of claim 11, wherein when the channel ion region is P+ the channel region of low concentration is P−, and when the channel ion region is N+ the same is N−.

13. A method to implant impurity ions, comprising:

forming an insulation film on a semiconductor substrate;

etching said insulation film to expose an active region of said substrate;

forming a conductive film over said active region such that a height of said conductive film over a center portion of said active region is lower than a height of said conductive over end portions of said active region; and implanting impurity ions through said conductive film over said center portion of said active region.

14. The method of claim 13, wherein the energy of said impurity ions is such that said impurity ions substantially penetrates said conductive film over said center portion of said active region, but does not substantially penetrate said conductive film over said end portions of said active region.

15. The method of claim 13, wherein said impurity ions are of different type than ions of said active region.

* * * * *